(12) United States Patent
Vester

(10) Patent No.: US 9,864,024 B2
(45) Date of Patent: Jan. 9, 2018

(54) REDUCTION OF COUPLING EFFECTS BETWEEN COIL ELEMENTS OF A MAGNETIC RESONANCE COIL ARRANGEMENT

(71) Applicant: Markus Vester, Nürnberg (DE)

(72) Inventor: Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 924 days.

(21) Appl. No.: 13/861,249

(22) Filed: Apr. 11, 2013

(65) Prior Publication Data

US 2013/0271143 A1    Oct. 17, 2013

(30) Foreign Application Priority Data

Apr. 12, 2012    (DE) .................. 10 2012 206 008

(51) Int. Cl.
*G01R 33/36*    (2006.01)
(52) U.S. Cl.
CPC ....... *G01R 33/3628* (2013.01); *G01R 33/365* (2013.01)
(58) Field of Classification Search
USPC ................ 324/300–322; 600/407–435
See application file for complete search history.

(56) References Cited

U.S. PATENT DOCUMENTS

| | | | |
|---|---|---|---|
| 4,450,408 A | 5/1984 | Tiemann | |
| 4,825,162 A * | 4/1989 | Roemer | G01R 33/3415 324/312 |
| 5,243,289 A * | 9/1993 | Blum | G01R 33/3635 324/322 |
| 6,459,265 B1 * | 10/2002 | Lou | G05F 1/70 324/318 |
| 7,511,500 B2 * | 3/2009 | Schiano | G01R 33/341 324/318 |
| 7,986,143 B2 * | 7/2011 | Walsh | A61B 5/055 324/309 |
| 8,882,670 B2 * | 11/2014 | Hancock | A61B 5/05 600/309 |

(Continued)

OTHER PUBLICATIONS

German Office Action dated Dec. 7, 2012 for corresponding German Patent Application No. DE 10 2012 206 008.1 with English translation.

(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

A magnetic resonance coil arrangement for a magnetic resonance device includes at least two coil elements that may be read and/or controlled via an amplifier, and a matching circuit for power and/or noise matching between the at least two coil elements and the amplifier. Components of the matching circuit are dimensioned for wideband matching to a frequency band. The frequency band is limited by outermost relevant coupling modes that are displaced from the resonant frequency. The coupling modes occur due to the interaction of a coil element with at least one adjacent coil element.

10 Claims, 2 Drawing Sheets

(56) References Cited

U.S. PATENT DOCUMENTS

| | | | | |
|---|---|---|---|---|
| 2008/0001602 A1* | 1/2008 | Schiano | ............... | G01R 33/341 324/318 |
| 2008/0319285 A1* | 12/2008 | Hancock | .............. | A61B 5/0507 600/309 |
| 2011/0095758 A1* | 4/2011 | Walsh | .................... | A61B 5/055 324/307 |
| 2013/0271143 A1* | 10/2013 | Vester | .................. | G01R 33/365 324/322 |

OTHER PUBLICATIONS

Reykowski et al., "Do We Need Preamplifier Decoupling?", Proc. Intl. Soc. Mag. Reson. Med. 19 (2011).

Reykowski et al., "Rigid Signal-to-Noise Analysis of Coupled MRI Coils Connected to Noisy Preamplifiers and the Effect of Coil Decoupling on Combined SNR", Siemens Medical Engineering, pp. 1402-2000, (2000).

Lopez, Harold A. Wheeler's Antenna Design Legacy, IEEE, pp. 108-113, (2007).

* cited by examiner

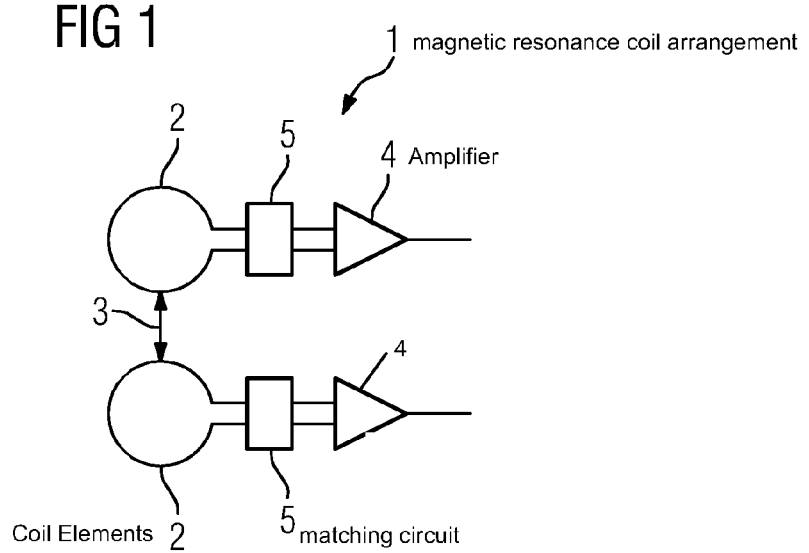
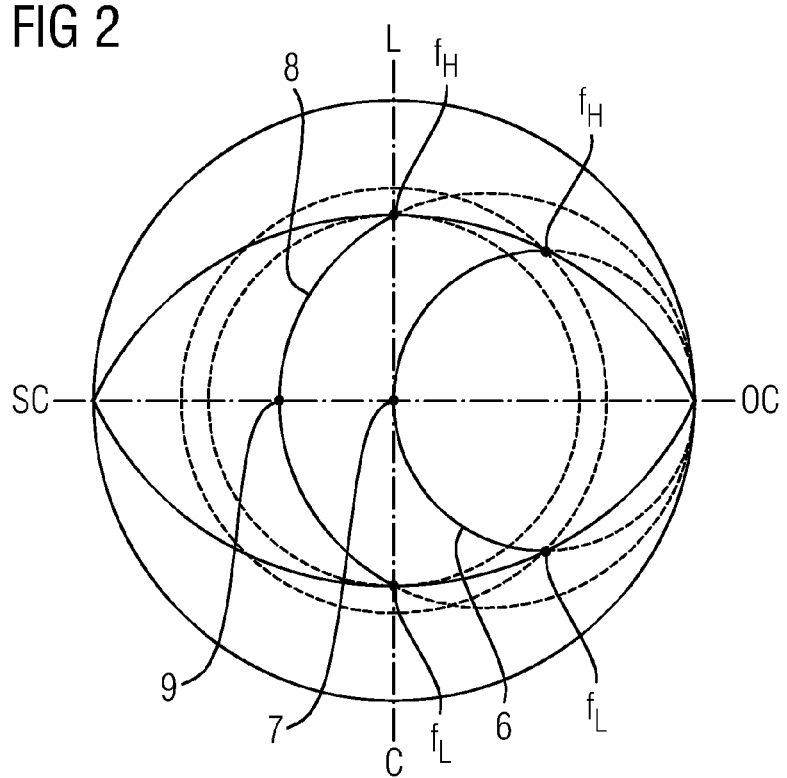

REDUCTION OF COUPLING EFFECTS BETWEEN COIL ELEMENTS OF A MAGNETIC RESONANCE COIL ARRANGEMENT

This application claims the benefit of DE 10 2012 206 008.1, filed on Apr. 12, 2012, which is hereby incorporated by reference.

BACKGROUND

The present embodiments relate to a magnetic resonance coil arrangement for a magnetic resonance device.

In the context of magnetic resonance imaging, coil arrangements are used in two respects. First, transmitter coil arrangements (e.g., body coils) are used to produce high frequency excitation. Using receiver coil arrangements (e.g., local coils), magnetic resonance signals may be received. Combined transmitter and receiver coil arrangements are also known.

Receiver coil arrangements and, for example, in the case of parallel transmission (pTX), transmitter coil arrangements have a plurality of separately controllable or readable coil elements (e.g., conductor loops). The problem arises, during operation, that the coil elements relatively close to one another, at least in the case of adjacent coil elements, form mutually coupled systems. Due to the unwanted coupling between elements of such a coil arrangement (e.g., an antenna array), in the case of reception, noise contribution from the pre-amplifier is increased. In the case of transmission, the proportion of the transmission power taken up by the coil elements is reduced. Thus, losses are produced.

Approaches to solving this problem from the prior art may decouple the coil elements from one another. This provides that the cause of the problem (e.g., the coupling) may be overcome. A number of approaches to this solution are known, such as decoupling immediately adjacent coil elements using geometrical overlap or the use of decoupling capacitors between the coil elements. Coupling to relatively remote coil elements may be accepted.

SUMMARY AND DESCRIPTION

The present embodiments may obviate one or more of the drawbacks or limitations in the related art. For example, an alternative, simply implemented method for reducing the noise and/or power losses created by the coupling of coil elements is provided.

In a magnetic resonance coil arrangement, components of the matching circuit are dimensioned for wideband matching to a frequency band. The frequency band is limited by outermost relevant coupling modes displaced from the resonant frequency. The coupling modes occur due to an interaction of a coil element with at least one adjacent coil element.

One or more of the present embodiments are based on concepts concerning the causes of the effects to be reduced. It is known that, in the case of transmission, power matching (e.g., impedance matching) takes place. This provides that the output impedance of the power amplifier is matched via a matching circuit that may be assigned to an input impedance of the coil element. In the case of reception, noise matching takes place. This provides that the output impedance of the coil element is selected or transformed so as to approximate to the noise-optimized source impedance of the pre-amplifier. For this purpose, a suitable matching circuit may also be assigned to the coil element. For coil elements that are intended both to transmit and receive, a fixed impedance of the coil element (e.g., 50 Ohm) may be pre-determined by the matching circuit. Using this, through further matching circuits installed in the power amplifier and the pre-amplifier, the selected impedance (e.g., 50 Ohm) is equal to the optimum load impedance of the power amplifier and to the noise-optimized source impedance of the pre-amplifier.

The cause of the power losses during transmission and the increased noise during reception is reflection brought about by non-optimal matching. Matching of the coil elements may be carried out and the components of the matching circuit are therefore thus dimensioned, so that it may be assumed that transmission and reception takes place at the resonant frequency (e.g., the magnetic resonance frequency), which is correct for a single, decoupled coil element. However, through the coupling to other coil elements, a plurality of coupling modes come about and, in the case of two coupled coil elements, for example, two coupling modes, equally spaced from the resonant frequency as the middle frequency, arise. One of the two coupling modes involves in-phase oscillation, and the other of the two coupling modes involves anti-phase oscillation. Both modes are to be taken into account, and there is to be a reduction in the coupling effects for both. This is described in greater detail below for the receiving case.

Inductive coupling between coil elements may be the inclusion of a lambda/4 line between the ground connection of two source resistances, as described by Reykowski and Wang, "Rigid Signal-to-Noise Analysis of Coupled MRI Coils Connected to Noisy Preamplifiers and the Effect of Coil Decoupling on Combined SNR" in Proceedings of ISMRM 2000, page 1402 (see also Reykowski, Saylor and Dünsing, "Do we need preamplifier decoupling?" in Proceedings of ISMRM 2011, page 3883). Noise current from a pre-amplifier is transferred to the other system as an additional noise voltage. This "noise coupling" may be, for two coil elements, due to non-agreement of the two fundamental coupling modes thereof, as mentioned above (e.g., an "even" coupling mode with parallel currents and fields, and an "odd" coupling mode with antiparallel currents and fields). If equivalent current circuits are considered for both modes, for the even coupling mode, the mismatch is the same as in a single amplifier, where an upward deviation of the impedance is given by a particular relative blind impedance jkQ, determined by the coupling (e.g., $1*(1+jkQ)$ instead of 1). For the odd coupling mode, there is a downward deviation (e.g., $2*(1-jkQ)$ instead of 2). Therefore, a deviation from the noise-optimized impedance exists, by the same amount, for both coils in the reception case. The deviations, however, exist in different directions, so that a correction relating to one of the coupling modes would significantly increase the noise effect of the other mode. This is not desirable because, at best, an improvement would be achieved therewith for particular parts of the image, but not for the entire recording region or object space.

The method therefore reduces, for example, the reflections for both coupling modes simultaneously. Wideband matching, which is known from other application areas for individual antennae, may be carried out in that a frequency band is defined by the two outermost of the relevant coupling modes. Which modes are concerned is to be clarified based on a corresponding investigation for the relevant coil arrangement. The spectrum may be determined by simultaneous calculations and/or measurements (e.g., a double probe measurement). Which coupling modes are relevant may then be determined, by a user or automatically, for example, on the basis of threshold values.

The concept of broadband matching, which was first proposed by H. A. Wheeler, is that minimum reflection (e.g., a minimum reflection factor) may be achieved at edges of the frequency band if matching is performed to the amount of the source impedance at the edges and not to a real part present in the band middle alone. A transformer utilized as part of the matching circuit, for example, is used for this purpose. For the situation set out above with two coil elements, in the reception case, the converter has an impedance ratio of |1+jkQ|. For broadband matching in the case of a single antenna, as known in the prior art, reference is made to a summarizing article concerning the work of Wheeler, "Harold A. Wheeler's Antenna Design Legacy", by Alfred R. Lopez, in Systems, Applications and Technology Conference, 2007, LISAT 2007, IEEE Long Island, pages 1-6.

The concept already known from the prior art of matching over a larger frequency bandwidth is transferred to a coil element system with a magnetic resonance coil arrangement operated at only one fixed resonant frequency, the magnetic resonance frequency, but detuned through coupling. By matching each coil element to the amplifier thereof, a lower level of mismatch across a greater frequency bandwidth may be achieved. By this, in the transmission case, the power losses returning to the transmitters are reduced and, in the reception case, the rise in the noise contribution from the pre-amplifier is lessened. One or more of the present embodiments may therefore be used for transmission and reception such that, in the case of a receiver coil arrangement, the amplifier is a pre-amplifier and/or in the case of a transmitter coil arrangement, the amplifier is a power amplifier.

In one embodiment, compared with matching that relates only to the resonant frequency, the coupling of the coil element to the amplifier is increased (e.g., in the case of a series-connected capacitor and a parallel-connected capacitor as components, the capacitance of the series-connected capacitor is increased and/or the capacitance of the parallel-connected capacitor is reduced). A stronger coupling of the amplifier to the coil element is therefore provided. This may take place, for example, with a suitable configuration of the matching circuit by increasing the capacitance of a series capacitor and reducing the capacitance of a parallel capacitor. In a Smith diagram, for performance of the broadband matching, this provides that the edges of the frequency band lie at a real part of the reflection factor having a value of zero.

A method for reducing coupling effects in a magnetic resonance coil arrangement for a magnetic resonance device is also provided. The method includes reading and/or controlling at least two coil elements via an amplifier, and power and/or noise matching a matching circuit between the coil element and the amplifier. Components of the matching circuit are dimensioned for wideband matching to a frequency band. The frequency band is limited by outermost relevant coupling modes displaced from the resonant frequency due to the interaction of a coil element with at least one adjacent coil element. All of the explanations above relating to the magnetic resonance coil arrangement may be similarly applied to the method.

The outermost relevant coupling modes may be determined on the basis of an intrinsic mode simulation and/or a measurement (e.g., a double probe measurement), as described above in relation to the magnetic resonance coil arrangement. The relevance of modes may be determined by a user taking account of background knowledge or making use of suitable criteria.

BRIEF DESCRIPTION OF THE DRAWINGS

FIG. 1 shows one embodiment of a magnetic resonance coil arrangement;

FIG. 2 is a Smith diagram of a reflection factor in an embodiment with two coil elements;

DETAILED DESCRIPTION

Figure 3:
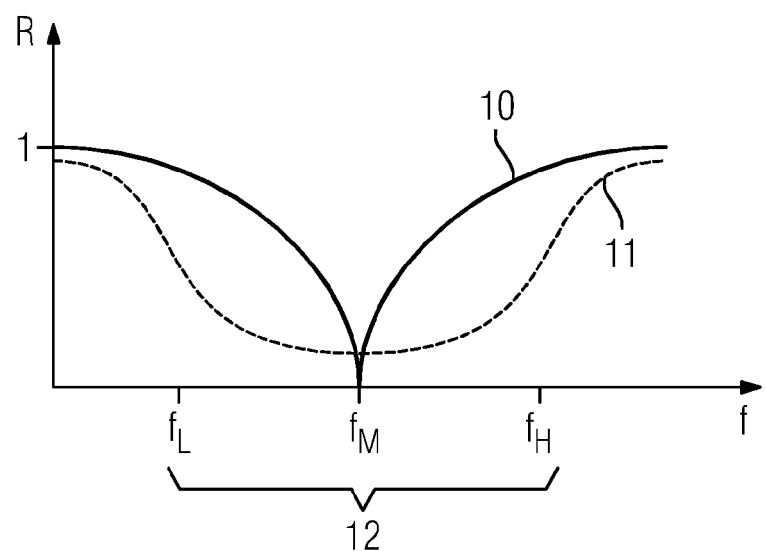
FIG. 3 is a graph showing reflection factor against frequency.

FIG. 1 shows one embodiment of a magnetic coil arrangement 1 (e.g., a receiver coil arrangement). The principle may be transferred to combined transmitter and receiver coil arrangements and pure transmitter arrangements. Using the pure transmitter, parallel transmitting may be achieved. Different phases may also be used, so that in the pure transmitter case, a static change in the impedance is not suitable for reducing coupling effects.

The magnetic resonance coil arrangement 1 includes a plurality of coil elements 2, of which only two are shown for the sake of clarity. The coil elements 2 are inductively coupled to one another (indicated by the arrow 3), so that coupling effects that have a negative effect on the noise from pre-amplifiers 4 to which the coil elements 3 are coupled via a matching circuit 5 with an impedance converter are produced.

The components of the matching circuits 5 are each dimensioned so that noise matching is carried out taking account of the coupling. The impedance is not transformed as though a single operating frequency were present at the resonant frequency (magnetic resonance frequency), but rather with regard to wideband matching. This relates to a frequency band that is determined by the frequencies of the two outermost relevant coupling modes that arise due to the coupling of the coil elements 2. The width of the frequency band depends on the degree of coupling and may be, for example, 5 MHz. In order to select the outermost relevant coupling modes, the spectrum may be determined by an intrinsic mode simulation and/or a measurement.

Therefore, if, for example, two coil elements 2 that couple with one another are provided, two fundamental coupling modes that may lie, for example, at $f_H$ and $f_L$ exist. If both are to be detected, the frequency band lies between the values $f_H$ and $f_L$. The concept of wideband matching is described in greater detail by reference to the Smith diagram (or 'Smith chart') in FIG. 2. In FIG. 2, the reflection factor is shown in the complex plane. OC and SC mark the limit cases of open circuit and short circuit. C and L represent purely capacitive and inductive limit cases, respectively, in which wattless power is generated.

The line 6 shows the case where impedance matching is carried out without taking account of the coupling for a coil element 2 (e.g., if 50 Ohm meets 50 Ohm). At the resonant frequency, which also represents the middle frequency of the frequency band (Point 7), a reflection factor of zero exists. This would be ideal if only this frequency existed. The coupling leads to a split. At the frequencies $f_H$ and $f_L$, a reflection factor that is clearly different from zero is present on the line 6, which, in this case, increases the pre-amplifier noise.

Therefore, the impedance matching is changed in relation to this case, such that the edge frequencies $f_H$, $f_L$, of the frequency band come to lie at a real part of the reflection factor of zero (cf. line 8). The point 7 is displaced to a point 9, accordingly. This transformation results in the smallest possible amount of the reflection factor that may be reached simultaneously at both band limits.

This effect is described in greater detail by reference to the graphs in FIG. 3. The line 10 shows the case of line 6. Although no reflection takes place at the resonant frequency (e.g., middle frequency) $f_M$, the reflection increases rapidly as soon as any deviation occurs. The line 11 corresponds to the case of the line 8. Although reflection from zero no longer takes place at the middle frequency, the reflection remains low over the entire frequency band 12.

Therefore, no impedance matching to the input impedance of the pre-amplifier 4 (as per the line 6) is carried out, although this is usual in the prior art. Rather, impedance matching to another value that corresponds to the line 8 is carried out. This results in particular dimensioning of the components (e.g., a stronger coupling of the coil elements 2 to the pre-amplifier 4).

Figure 4:
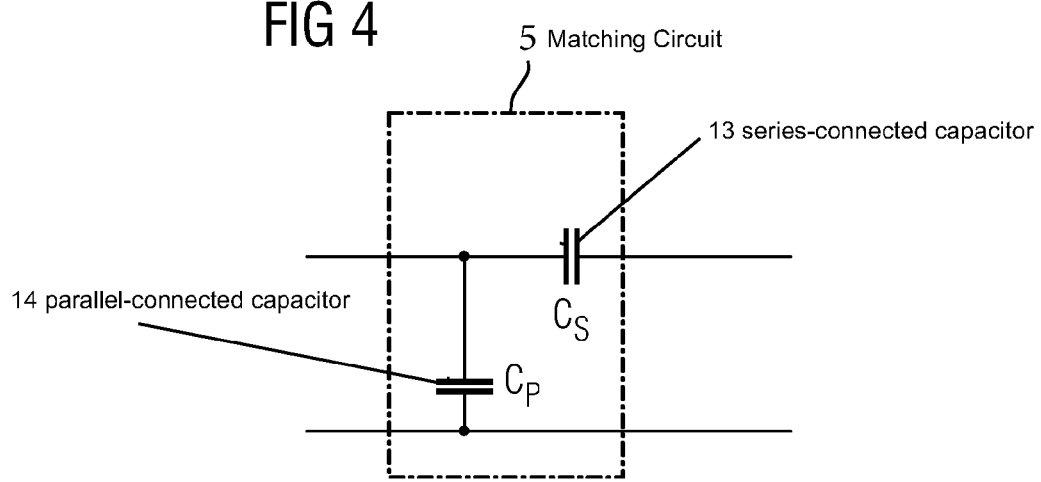
FIG. 4 is an exemplary realization of the matching circuit.

This is described in greater detail with reference to FIG. 4. In FIG. 4, the matching circuit 5 is a simple variant, using a series-connected capacitor 13 with a capacitance Cs and a parallel-connected capacitor 14 with a capacitance Cp. Compared with the matching circuits of the prior art, in the present case, for stronger coupling of the coil element 2 to the amplifier 4, the capacitance Cs is increased, and/or the capacitance Cp is reduced. Other variants of the matching circuit 5 that suitably convert the impedance and contain suitably dimensioned components in order to realize the wideband matching may be provided.

Although the invention has been illustrated and described in detail by reference to the exemplary embodiment, the invention is not limited to the examples disclosed, and other variations may be derived therefrom by a person skilled in the art without departing from the protective scope of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil arrangement configured for a magnetic resonance device, the magnetic resonance coil arrangement comprising:
   an amplifier;
   at least two coil elements that are readable, controllable, or readable and controllable via the amplifier,
   wherein the at least two coil elements include a frequency corresponding to at least two outermost relevant coupling modes identified from a previously acquired measurement of a coupling of the at least two coil elements; and
   a matching circuit comprising components that are configured in order to permit wideband matching to a frequency band, wherein a minimum reflection factor value is achieved at edges of the frequency band when wideband matching is performed with respect to the magnitude of a coupling source impedance at the edges and not at a band middle,
   wherein at a middle position of the frequency band, the reflection factor value achieved is different from a zero value, and
   wherein the matching circuit is configured to match power, noise, or power and noise between the at least two coil elements and the amplifier based on the minimum refection factor value and the coupling source impedance.

2. The magnetic resonance coil arrangement of claim 1, wherein the magnetic resonance coil arrangement is a transmitter coil arrangement, a receiver coil arrangement, or a transmitter and receiver coil arrangement.

3. The magnetic resonance coil arrangement of claim 2, wherein the magnetic resonance coil arrangement is the receiver coil arrangement, and
   wherein the amplifier is a pre-amplifier.

4. The magnetic resonance coil arrangement of claim 2, wherein the magnetic resonance coil arrangement is the transmitter coil arrangement, and
   wherein the amplifier is a power amplifier.

5. The magnetic resonance coil arrangement of claim 2, wherein the magnetic resonance coil arrangement is the transmitter and receiver coil arrangement, and
   wherein in the receiver coil arrangement, the amplifier is a pre-amplifier, and in the transmitter coil arrangement, the amplifier is a power amplifier.

6. The magnetic resonance coil arrangement of claim 2, wherein compared with matching relating only to a resonant frequency, the coupling of the at least two coil elements to the amplifier is increased.

7. The magnetic resonance coil arrangement of claim 6, wherein the matching circuit comprises:
   a series connected capacitor; and
   a parallel connected capacitor,
   wherein when, a capacitance of the series connected capacitor is increased, a capacitance of the parallel connected capacitor is reduced, or the capacitance of the series connected capacitor is increased, and the capacitance of the parallel connected capacitor is reduced.

8. The magnetic resonance coil arrangement of claim 1, wherein the first outer coupling mode and the second outer coupling mode are defined by an interaction of a coil element of the at least two coil elements with at least one adjacent coil element of the at least two coil elements.

9. A method of reducing coupling effects in a magnetic resonance coil arrangement of a magnetic resonance device, the method comprising:
   reading at least two coil elements via an amplifier, wherein the at least two coil elements include a frequency corresponding to at least two outermost relevant coupling modes identified from a previously acquired measurement of a coupling of the at least two coil elements;
   configuring the at least two coil elements in order to permit wideband matching to a frequency band, wherein a minimum reflection factor value is achieved at edges of the frequency band when wideband matching is performed with respect to the magnitude of a coupling source impedance at the edges and not at a band middle, wherein at a middle position of the frequency band, the reflection factor value achieved is different from a zero value; and
   power matching, noise matching, or power and noise matching, with a matching circuit, between the at least two coil elements and the amplifier based on the minimum reflection factor value and the coupling source impedance.

10. The method of claim 9 wherein the previously acquired measurement is a double probe measurement.

* * * * *